US012695448B2

(12) United States Patent
Arai et al.

(10) Patent No.: US 12,695,448 B2
(45) Date of Patent: Jul. 28, 2026

(54) POWER SEMICONDUCTOR MODULE

(71) Applicant: Minebea Power Semiconductor Device Inc., Ibaraki (JP)

(72) Inventors: Taiga Arai, Hitachi (JP); Katsuaki Saito, Hitachi (JP); Daisuke Kawase, Hitachi (JP); Akira Mima, Tokyo (JP); Takashi Wada, Hitachi (JP)

(73) Assignee: MINEBEA POWER SEMICONDUCTOR DEVICE INC., Ibaraki (JP)

( * ) Notice: Subject to any disclaimer, the term of this patent is extended or adjusted under 35 U.S.C. 154(b) by 0 days.

(21) Appl. No.: 18/729,868

(22) PCT Filed: Oct. 11, 2022

(86) PCT No.: PCT/JP2022/037782
§ 371 (c)(1),
(2) Date: Jul. 17, 2024

(87) PCT Pub. No.: WO2023/145144
PCT Pub. Date: Aug. 3, 2023

(65) Prior Publication Data
US 2025/0112631 A1 Apr. 3, 2025

(30) Foreign Application Priority Data
Jan. 27, 2022 (JP) ................................. 2022-010757

(51) Int. Cl.
*H03K 17/08* (2006.01)
*H02M 1/32* (2007.01)
(Continued)

(52) U.S. Cl.
CPC .......... *H03K 17/0828* (2013.01); *H02M 1/32* (2013.01); *H02M 7/003* (2013.01)

(58) Field of Classification Search
CPC ..... H03K 17/0828; H02M 1/32; H02M 7/003
See application file for complete search history.

(56) References Cited

U.S. PATENT DOCUMENTS

2002/0024134 A1 * 2/2002 Arai ...................... H01L 25/072
257/723
2010/0059028 A1 3/2010 Ueno
(Continued)

FOREIGN PATENT DOCUMENTS

JP 10-289977 A 10/1998
JP H10289977 A * 10/1998
(Continued)

OTHER PUBLICATIONS

International Search Report of PCT/JP2022/037782 date Nov. 29, 2022.
(Continued)

*Primary Examiner* — Daniel C Puentes
(74) *Attorney, Agent, or Firm* — MATTINGLY & MALUR, PC

(57) ABSTRACT
To provide a technique enabling stable protection of a switching element at the time of short circuit by suppressing jumping of the voltage Vge between a gate terminal and a reference potential terminal at the time of occurrence of short circuit. A power semiconductor module having at least an upper arm, includes: a Zener diode connected between a gate terminal and a reference potential terminal and provided on the outside of a semiconductor chip of a switching element and provided on an insulating substrate; a casing which houses the insulating substrate; and a plurality of external electrodes provided to the casing and connected to the gate terminal and the reference potential terminal.

7 Claims, 11 Drawing Sheets

1

(51) Int. Cl.
  *H02M 7/00* (2006.01)
  *H03K 17/082* (2006.01)

(56) References Cited

U.S. PATENT DOCUMENTS

| | | | |
|---|---|---|---|
| 2014/0070839 | A1 | 3/2014 | Miyazawa |
| 2016/0308523 | A1 | 10/2016 | Otake et al. |
| 2020/0091910 | A1 | 3/2020 | Hiratsuka et al. |

FOREIGN PATENT DOCUMENTS

| | | | |
|---|---|---|---|
| JP | 2003-023769 A | 1/2003 |
| JP | 2010-045141 A | 2/2010 |
| JP | 2010-088299 A | 4/2010 |
| JP | 2013-090223 A | 5/2013 |
| JP | 2014-056968 A | 3/2014 |
| JP | 2015-126342 A | 7/2015 |
| JP | 2016-066974 A | 4/2016 |
| JP | 2020-047674 A | 3/2020 |
| JP | 2020-124030 A | 8/2020 |

OTHER PUBLICATIONS

Extended European Search Report received in corresponding European Application No. 22924002.3 dated Dec. 8, 2025.
Japanese Office Action received in corresponding Japanese Application No. 2022-010757 dated Nov. 4, 2025.
Japanese Office Action received in corresponding Japan Application No. 2022-010757 dated Feb. 3, 2026.

\* cited by examiner

1

<u>1</u>

<u>1</u>

<u>1</u>

<u>1a</u>

1a

POWER SEMICONDUCTOR MODULE

TECHNICAL FIELD

The present disclosure relates to a power semiconductor module and is a technique effective to be applied to a power semiconductor module in which a switching element is provided on an insulating substrate.

BACKGROUND ART

The structures of a power semiconductor module include a 1-in-1 structure, a 2-in-1 structure, and a 6-in-1 structure. In the 1-in-1 structure, in one power semiconductor module, one switching element (also called a power semiconductor element) or one switching element and one diode which are inverse-parallel connected constructing one arm is/are mounted. In the 2-in-1 structure, a half bridge circuit having two arms (an upper arm and a lower arm) is configured in one power semiconductor module. For example, two insulating substrates having the 1-in-1 structure are connected in series in a module, one of them is set as an upper arm, and the other one is set as a lower arm. In the power semiconductor module having the 2-in-1 structure, the wiring distance between the upper arm and the lower arm can be made shorter as compared with that in the module having the 1-in-1 structure. Consequently, there are advantages such as downsizing and lower inductance. In the 6-in-1 structure, one module has six arms (three upper arms and three lower arms). A power semiconductor module has, as external electrodes, a positive-electrode terminal (positive-electrode main terminal), a negative-electrode terminal (negative-electrode main terminal), an AC terminal (AC main terminal), a gate terminal, and a reference potential terminal (also called emitter auxiliary terminal or auxiliary emitter terminal). Such a power semiconductor module is proposed in, for example, Japanese Unexamined Patent Application Publication Nos. 2016-066974, 2020-124030, and the like. As a switching element, a power field-effect transistor (MOSFET), an IGBT (Insulated Gate Bipolar Transistor), or the like can be used.

In the power semiconductor module having the 2-in-1 structure described in Japanese Unexamined Patent Application Publication No. 2020-124030, two insulating substrates on each of which a switching element and a diode constructing an upper arm are connected in parallel, and two insulating substrates on each of which a switching element and a diode constructing a lower arm are connected in parallel. With the configuration, the rated ampacity of the power semiconductor module can be increased.

By examination of known techniques performed after completion of the present invention, as a field-effect transistor or an IGBT in which a Zener diode is provided for a gate terminal, Japanese Unexamined Patent Application Publication Nos. 2010-045141, 2013-090223, and 2014-056968 were extracted. However, they are different from the present invention.

CITATION LIST

Patent Literature

Patent Literature 1: Japanese Unexamined Patent Application Publication No. 2016-066974
Patent Literature 2: Japanese Unexamined Patent Application Publication No. 2020-124030

Patent Literature 3: Japanese Unexamined Patent Application Publication No. 2010-045141
Patent Literature 4: Japanese Unexamined Patent Application Publication No. 2013-090223
Patent Literature 5: Japanese Unexamined Patent Application Publication No. 2014-056968

SUMMARY OF INVENTION

Technical Problem

The structure of a power semiconductor module is a 2-in-1 structure in which a switching element and a diode constructing an upper arm are connected in parallel, and a switching element and a diode constructing a lower arm are connected in parallel and in which IGBTs are used as the switching elements. A circuit in which two modules are connected in parallel to form two upper arms and two lower arms will be described. For convenience, two modules connected in parallel will be called a right-side module and a left-side module. For example, it is assumed that one of two switching elements constructing the lower arm (the lower arm of the left-side module: the left-side switching element) is broken (short-circuited), and short circuit current flows in the short-circuited switching element. It is also assumed that the other one of the two switching elements constructing the lower arm (the lower arm of the right-side module: the right-side switching element) is not short-circuited and is normal. By a gate driver, the two switching elements of the upper arm are turned on, and the two switching elements of the lower arm are turned off.

In this case, short-circuit current flows in the short-circuited switching element, so that the upper arm and the lower arm of the left-side module are short-circuited, and large current due to the short circuit flows in the upper arm and the lower arm. AC output current from the right-side module flows to the left-side module via an AC output wiring (transverse electric current occurs). Further, transverse electric current occurs also in the gate wiring and the emitter auxiliary wiring of the switching elements constructing the upper arm. By the transverse electric current, voltage is generated in parasitic inductance of the gate wiring and the emitter auxiliary wiring. It was found that, by this voltage, the voltage Vge between a gate terminal and a reference potential terminal (emitter auxiliary terminal) increases. Due to positive feedback by jumping of the potential Vge, larger short circuit current flows in the upper and lower arms. It was found that, consequently, protection of the switching elements in the on state (in this example, the two switching elements of the upper arm) is disturbed.

As a countermeasure, for example, there is a method of providing a Zener diode in a semiconductor chip of an IGBT. However, in a semiconductor chip of an IGBT, a test has to be conducted by applying voltage higher than operation voltage (for example, 20V or higher voltage with respect to gate signal input 15V driving) to a gate in order to check soundness of the gate. In this case, when a Zener diode is provided in the semiconductor chip of the IGBT, voltage which is equal to or higher than clamp voltage of the Zener diode cannot be applied to the gate, so that reliability of the gate cannot be assured.

There is also a method of providing a Zener diode on the outside of a power semiconductor module. However, the parasitic inductance of the wiring in a configuration example (attachment outside of the module) of providing a Zener diode on the outside of the power semiconductor module is higher as compared with that in a configuration example (attachment inside of the module) of providing a Zener diode on the inside of the power semiconductor module. Consequently, there is a problem that jumping of the large voltage Vge occurs in the event of short circuit breakage (mainly, at the time of inrush).

An object of the present disclosure is to provide a technique enabling stable protection of a switching element at the time of short circuit by suppressing jumping of the voltage Vge between a gate terminal and a reference potential terminal at the time of occurrence of short circuit.

Objects, and novel features other than the above will be apparent from the description of the present specification and accompanied drawings.

Solution to Problem

Among embodiments disclosed in the present application, a typical one of summary is briefly described as follows.

According to the present embodiment, a power semiconductor module having at least an upper arm, includes: a Zener diode connected between a gate terminal and a reference potential terminal and provided on the outside of a semiconductor chip of a switching element and provided on an insulating substrate; a casing which houses the insulating substrate; and a plurality of external electrodes provided to the casing and connected to the gate terminal and the reference potential terminal.

Advantageous Effects of Invention

According to a power semiconductor module in the one embodiment, provision of a Zener diode between a gate terminal and a reference potential terminal makes possible to suppress jumping of the voltage Vge between the gate terminal and the reference potential terminal (emitter auxiliary terminal) at the time of occurrence of short-circuit, whereby it is possible to provide a technique which enables stable protection of a switching element at the time of short circuit.

DESCRIPTION OF EMBODIMENTS

Figure 1:
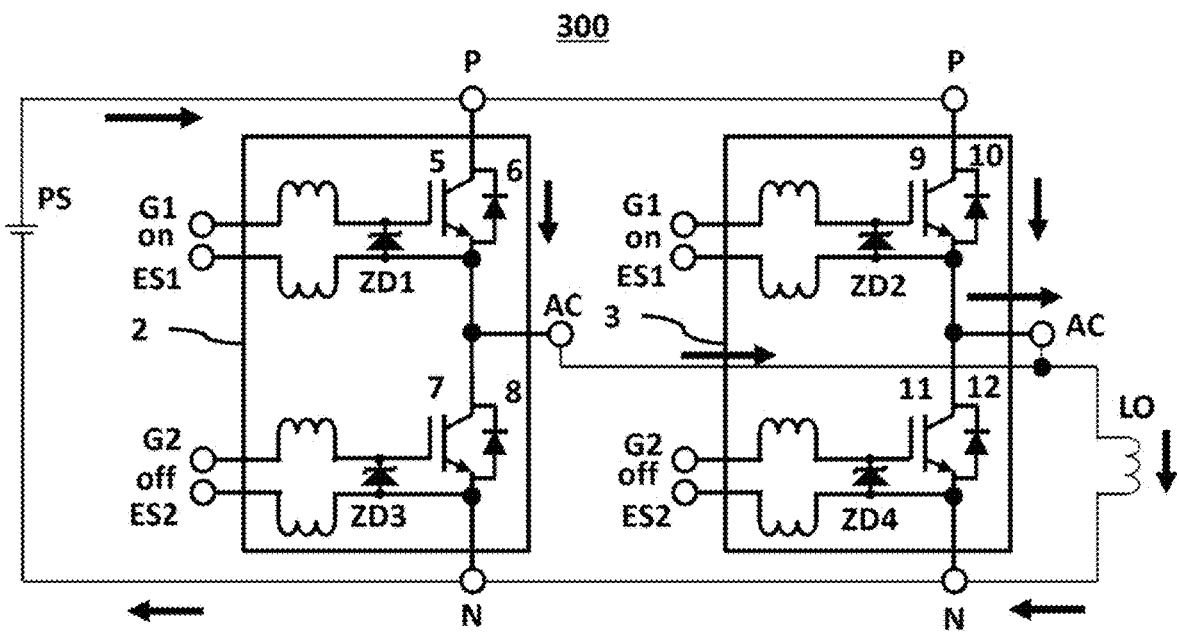
FIG. 1 is a diagram illustrating a configuration example of a power conversion device using two power semiconductor modules each having a 2-in-1 structure according to an embodiment.

Hereinafter, an embodiment, a comparative example, and a modification will be described with reference to the drawings. In the following description, the same reference numeral is designated to components having the same configuration, and repetitive description may not be given. To make description of a drawing more clearly, there is a case that a drawing is schematically expressed as compared with an actual mode. However, it is just an example and does not limit interpretation of the present invention.

Figure 2:
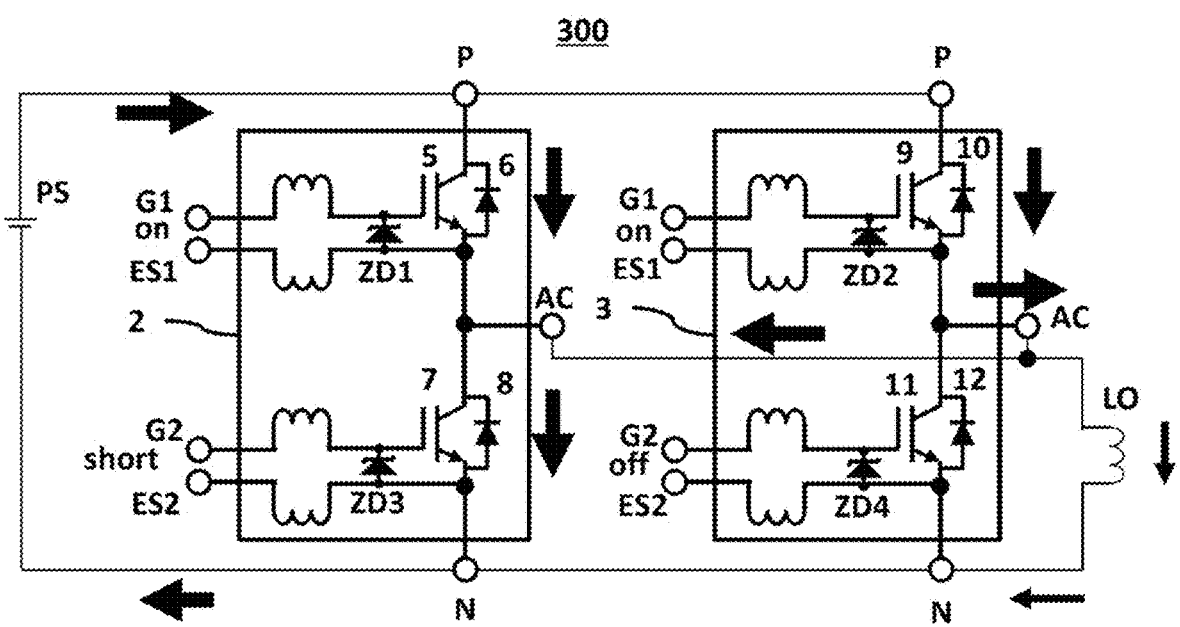
FIG. 2 is a diagram explaining an operation example of the power semiconductor modules of FIG. 1.
Figure 3:
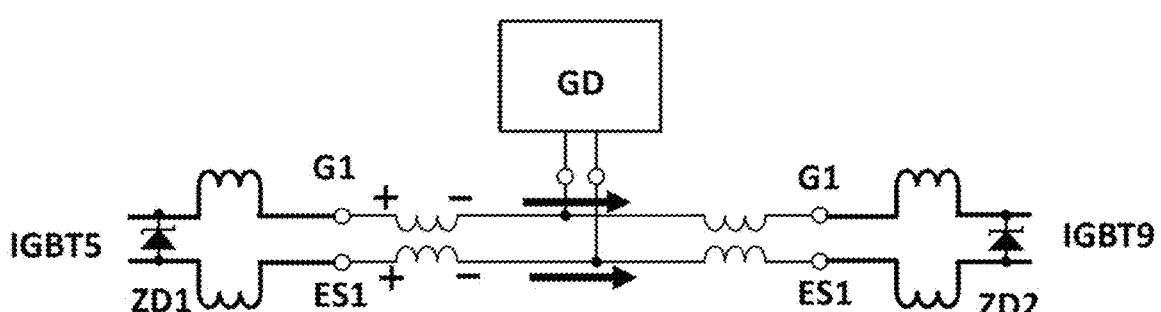
FIG. 3 is a diagram explaining an operation example of the power semiconductor modules of FIG. 1.

To facilitate understanding of an embodiment, first, a configuration example and a challenge of the present invention will be described with reference to the drawings. FIG. 1 is a diagram illustrating a configuration example of a power conversion device using two power semiconductor modules each having a 2-in-1 structure according to an embodiment. FIG. 2 is a diagram illustrating an operation example of the power semiconductor modules of FIG. 1. FIG. 3 is a diagram illustrating an operation example of the power semiconductor modules of FIG. 1.

As illustrated in FIG. 1, a power conversion device 300 has a configuration that two modules, a first power semiconductor module 2 and a second power semiconductor module 3 each having the 2-in-1 structure according to the embodiment, are connected in parallel. The first power semiconductor module 2 has a switching element 5 and a diode 6 constructing an upper arm and a switching element 7 and a diode 8 constructing a lower arm. The second power semiconductor module 3 has a switching element 9 and a diode constructing an upper arm and a switching element 11 and a diode 12 constructing a lower arm. The switching element and the diode 6 constructing the upper arm and the switching element 9 and the diode 10 constructing the upper arm are configured so as to operate in parallel. The switching element 7 and the diode 8 constructing the lower arm and the switching element 11 and the diode 12 constructing the lower arm are configured so as to operate in parallel. The first power semiconductor module 2 and the second power semiconductor module 3 having the same configuration are used.

In this example, the switching elements 5, 7, 9, and 11 are IGBTs (Insulated Gate Bipolar Transistors). The switching elements 5, 7, 9, and 11 may be power field-effect transistors (MOSFETs). In the case where the switching elements 5, 7, 9, and 11 are power field-effect transistors (MOSFETs), the collector of the IGBT is translated as the drain of the power field-effect transistor, and the emitter of the IGBT is translated as the source of the power field-effect transistor. In the following description, the switching elements 5, 7, 9, and 11 will be restated as the IGBTs 5, 7, 9, and 11.

The IGBT 5 has a collector terminal, a gate terminal, and an emitter terminal. The diode 6 has an anode terminal connected to the emitter terminal, and a cathode terminal connected to the collector terminal. Since the configurations of the IGBTs 7, 9, and 11 and the diodes 8, 10, and 12 are similar to those of the IGBT 5 and the diode 6, repetitive description will not be given.

The emitter terminals of the IGBTs 5, 7, 9, and 11 are an emitter auxiliary terminal (also called a reference potential terminal or an emitter sense terminal) and an emitter terminal on the insulating substrate. The emitter auxiliary terminal is a terminal for detecting reference potential of the emitter terminal and for an emitter-side input of a gate drive circuit. The emitter terminal of each of the IGBTs 5 and 9 is a terminal which is connected to an AC main terminal AC to be described later, and to which main current flows. The emitter terminal of each of the IGBTs 7 and 11 is a terminal which is connected to a negative-electrode main terminal N and to which main current flows. In the specification, for convenience, it may be described that "an IGBT has a collector terminal, a gate terminal, an emitter auxiliary terminal, and an emitter terminal". In the case of a power field-effect transistor (MOSFET), the reference potential terminal is a source auxiliary terminal (also called a source sense terminal).

Each of the first power semiconductor module 2 and the second power semiconductor module 3 is covered with a casing, and an external electrode is provided to the casing. The external electrodes include a positive-electrode main terminal P, the negative-electrode main terminal N, a gate electrode G1 for an upper arm (first gate electrode, first gate terminal), a gate electrode G2 for a lower arm (second gate electrode, second gate terminal), an emitter auxiliary electrode ES1 for an upper arm (first reference potential electrode, first reference potential terminal), an emitter auxiliary electrode ES2 for a lower arm (second reference potential electrode, second reference potential terminal), and the AC main terminal AC.

The positive-electrode main terminal P is electrically connected to the collector terminal of the IGBT 5, 9 by a wiring, a conductor, or the like. The negative-electrode main terminal N is electrically connected to the emitter terminal of the IGBT 7, 11 by a wiring, a conductor, or the like.

The gate electrode G1 for the upper arm is electrically connected to the gate terminal of the IGBT 5, 9 by a signal path formed by a wiring, a conductor, or the like. The gate electrode G2 for the lower arm is electrically connected to the gate terminal of the IGBT 7, 11 by a signal path formed by a wiring, a conductor, or the like. The gate electrode G1 for the upper arm and the gate electrode G2 for the lower arm are connected to the gate driver GD which will be described later to supply a gate signal to the gate terminals of the IGBTs 5 and 9 and the gate terminals of the IGBTs 7 and 11.

The emitter auxiliary electrode ES1 for the upper arm is electrically connected to the emitter auxiliary terminal of the IGBT 5, 9 by a signal path formed by a wiring, a conductor, or the like. The emitter auxiliary electrode ES2 for the lower arm is electrically connected to the emitter auxiliary terminal of the IGBT 7, 11 by a signal path formed by a wiring, a conductor, or the like. The emitter auxiliary electrode ES1 for the upper arm and the emitter auxiliary electrode ES2 for the lower arm are terminals for detecting the reference potential of the emitter auxiliary terminals of the IGBTs 5 and 9 and the emitter auxiliary terminals of the IGBTs 7 and 11 and are connected to the gate driver GD.

The AC main terminal AC is electrically connected to the emitter terminal of the IGBT 5, 9 and the collector terminal of the IGBT 7, 11 by a wiring, a conductor, or the like.

On the outside of the power conversion device 300, a power source PS is connected between the positive-electrode main terminal P and the negative-electrode main terminal N. On the other hand, in the first power semiconductor module 2, the upper arm (5, 6) and the lower arm (7, 8) are connected in series between the positive-electrode main terminal P and the negative-electrode main terminal N. The connection point between the upper arm (5, 6) and the lower arm (7, 8) is the AC main terminal AC. In the second power semiconductor module 3, the upper arm (9, 10) and the lower arm (11, 12) are connected in series between the positive-electrode main terminal P and the negative-electrode main terminal N. The connection point between the upper arm (9, 10) and the lower arm (11, 12) is the AC main terminal AC.

On the outside of the power conversion device 300, a load element LO such as a motor is connected between the AC main terminal AC and the negative-electrode main terminal N.

The AC main terminal AC of the first power semiconductor module 2 and the AC main terminal AC of the second power semiconductor module 3 are electrically connected by an internal wiring, a conductor, or the like in the power conversion device 300 so as to be the AC main terminal AC of the power conversion device 300.

Between the gate terminals and the emitter auxiliary terminals of the IGBTs 5 and 9, Zener diodes ZD1 and ZD2 are connected. In other words, the gate electrode G1 for the upper arm of the first power semiconductor module 2 and the emitter auxiliary electrode ES1 for the upper arm are connected by the Zener diode ZD1, and the gate electrode G1 for the upper arm of the second power semiconductor module 3 and the emitter auxiliary electrode ES1 for the upper arm are connected by the Zener diode ZD2 in the respective modules. The anode terminals of the Zener diodes ZD1 and ZD2 are connected to the emitter auxiliary terminals (the emitter auxiliary electrodes ES1 for the upper arm), and the cathode terminals of the Zener diodes ZD1 and ZD2 are connected to the gate terminals (the gate electrodes G1 for the upper arm).

Between the gate terminal of the IGBT 7 and the emitter auxiliary terminal, a Zener diode ZD3 is connected. Between the gate terminal of the IGBT 11 and the emitter auxiliary terminal, a Zener diode ZD4 is connected. In other words, the gate electrode G2 for the lower arm of the first power semiconductor module 2 and the emitter auxiliary electrode ES2 for the lower arm are connected by the Zener diode ZD3, and the gate electrode G2 for the lower arm of the second power semiconductor module 3 and the emitter auxiliary electrode ES2 for the lower arm are connected by the Zener diode ZD4 in each of the module. The anode terminals of the Zener diodes ZD3 and ZD4 are connected to the emitter auxiliary terminals (the emitter auxiliary electrode ES2 for the lower arm), and the cathode terminals of the Zener diodes ZD3 and ZD4 are connected to the gate terminals (the gate electrodes G2 for the lower arm).

Preferably, a Zener voltage VZ as the breakdown voltage in the inverse direction of the Zener diodes ZD1 to ZD4 is set to a voltage value (gate voltage+about 1V) obtained by adding a predetermined voltage (for example, about 1V) to the gate voltage which sets the IGBT (5, 7, 9, 11) to the on state.

As illustrated in FIG. 1, in the case where the upper arm (the upper arm (5, 6) on the left-side module, the upper arm (9, 10) of the right-side module), the lower arm (the lower arm (7, 8) on the left-side module, and the lower arm (11, 12) on the right-side module) are normal without a failure, the upper arm is turned on, and the lower arm is turned off by the not-illustrated gate driver GD. At this time, as illustrated by the arrows, the current flows from the positive electrode of the power source PS to the negative electrode of the power source PS via the positive-electrode main terminal P, the upper arms (5, 9), the AC main terminal AC, the load element LO, and the negative-electrode main terminal N.

In the case of turning on the IGBT (5, 7, 9, 11), the gate driver GD controls and applies the gate voltage so that the gate terminal has the positive potential with respect to the potential of the emitter auxiliary terminal. On the other hand, in the case of turning off the IGBT (5, 7, 9, 11), the gate driver GD controls and applies the gate voltage so that the gate terminal has zero potential or negative potential with respect to the voltage of the emitter auxiliary terminal.

FIG. 2 illustrates, as one of failure modes, the case where the IGBT 7 is broken (short-circuited) of the lower arm (7, 8) of the left-side module, and short circuit current flows in the short-circuited IGBT 7. It is assumed that the IGBT 11 as a component of the lower arm (11, 12) of the right-side module, and the IGBTs 5 and 9 of the upper arms are not short-circuited and are normal. It is also assumed that the two IGBTs 5 and 9 of the upper arms are turned on and the two IGBTs 7 and 11 of the lower arms are turned off by the gate driver GD.

In this case, short-circuit current flows in the short-circuited IGBT 7, so that the upper and lower arms in the left-side module are short-circuited, and heavy current caused by the short circuit flows in the upper and lower arms.

AC output current from the side of the IGBT 9 in the right-side module flows to the side of the IGBT 5 in the left-side module via the internal wiring (transverse electric current is generated). Further, as illustrated in FIG. 3, transverse electric current is generated also in the gate internal wiring between the gates G1 and G1 of the IGBTs 5 and 9 constructing the upper arm and the emitter auxiliary internal wiring between the emitter auxiliary terminals ES1 to ES1 of the IGBTs 5 and 9. By the transverse electric current, voltage is generated in parasitic inductance of the gate internal wiring and the emitter auxiliary internal wiring. By this voltage, voltage Vge between the gate terminal G1 and the emitter auxiliary terminal ES1 of each of the IGBTs 5 and 9 increases.

However, when the voltage Vge reaches the Zener voltage VZ of the Zener diodes ZD1 and ZD2, the Zener diodes ZD1 and ZD2 enter a breakdown state, and the voltage Vge is clamped at the Zener voltage VZ. In other words, by the Zener diodes ZD1 and ZD2 between the gate terminals G1 and the emitter auxiliary terminals ES1, rise of the voltage Vge between the gate terminal G1 and the emitter auxiliary terminal ES1 can be suppressed. Therefore, since positive feedback by further rise of the voltage Vge (jump of Vge) can be suppressed, larger short circuit current can be prevented from flowing in the upper and lower arms. As a result, the switching elements in the on state (in this example, the two switching elements of the upper arm: IGBTs 5 and 9) can be protected.

The gate signal input of the IGBT (5, 7, 9, 11) is, for example, +15V (in the case of the on state) and −15V (in the case of the off state), or +15V (in the case of the on state) and 0V (in the case of the off state). On the other hand, the Zener voltage VZ as the breakdown voltage in the inverse direction of the Zener diodes ZD1 to ZD4 is preferably +15V+1V=+16V or so. Consequently, the clamp voltage of the voltage Vge can be set to about +16V, so that the switching element (IGBT 5, 9) in the on state can be reliably protected.

Figure 4:
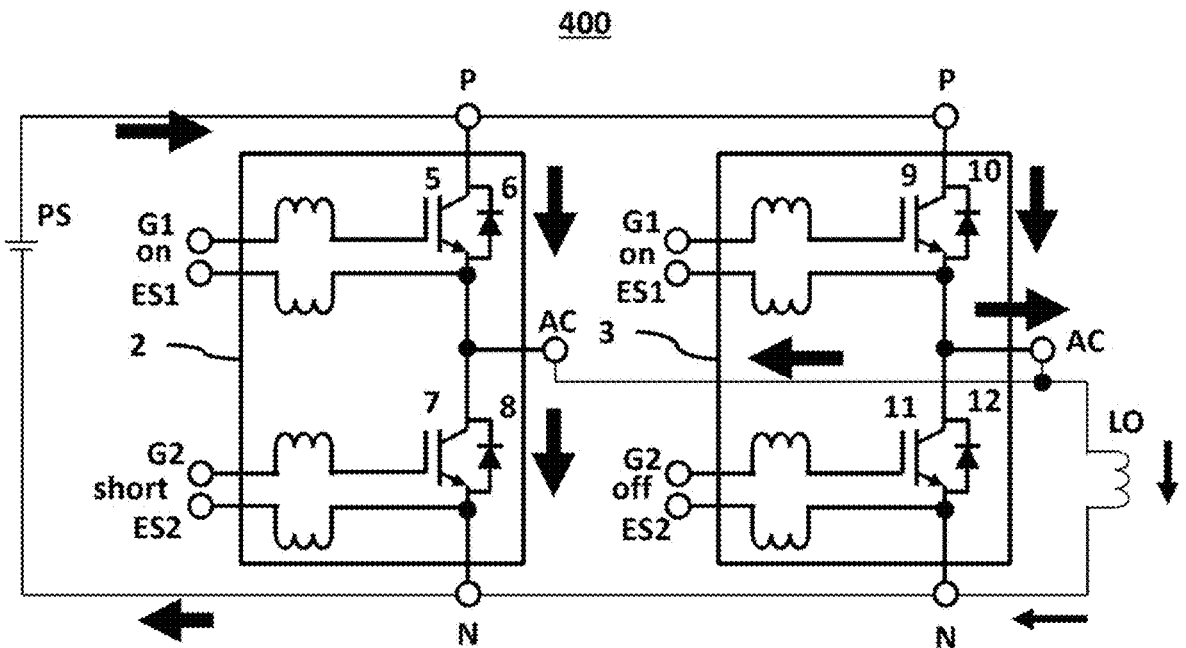
FIG. 4 is a diagram illustrating a problem in a power semiconductor module according to a comparative example.
Figure 5:
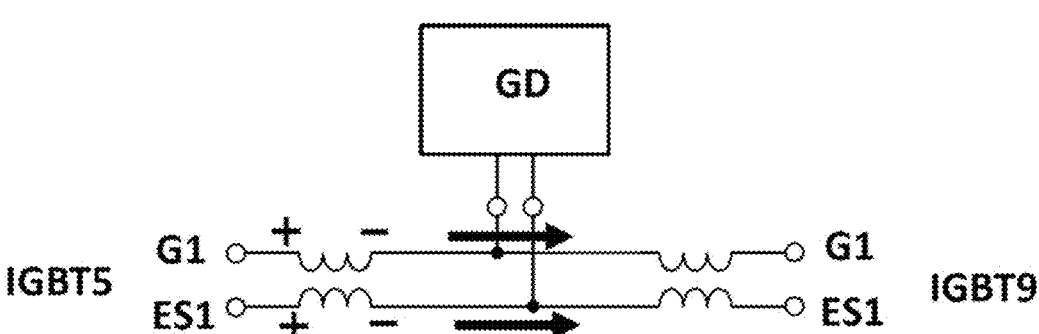
FIG. 5 is a diagram illustrating a problem of the power semiconductor module of FIG. 4.

FIG. 4 is a diagram explaining a problem in a power semiconductor module according to a comparative example. FIG. 5 is a diagram explaining a problem of the power semiconductor module of FIG. 4. FIG. 4 illustrates a configuration example of a power semiconductor module of a power conversion device 400 obtained by eliminating the Zener diodes ZD1 to ZD4 from the power semiconductor module of FIG. 1.

Like FIG. 2, FIG. 4 illustrates, as one of failure modes, the case where the IGBT 7 in the lower arm (7, 8) of the left-side module is broken (short-circuited), and short-circuit current flows in the short-circuited IGBT 7. It is assumed that the IGBT 11 as a component of the lower arm (11, 12) of the right-side module and the IGBTs 5 and 9 of the lower arm are not short-circuited and are normal. It is also assumed that the two IGBTs 5 and 9 of the upper arms are turned on and the two IGBTs 7 and 11 of the lower arms are turned off by the gate driver GD.

In this case, short-circuit current flows in the short-circuited IGBT 7, so that the upper and lower arms are short-circuited, and heavy current caused by short circuit flows in the upper and lower arms.

The AC output current from the side of the IGBT 9 of the right-side module flows to the side of the IGBT 5 of the left-side module via the internal wiring (transverse current is generated). Further, as illustrated in FIG. 5, the transverse electric current is generated also in the gate internal wiring between the gates G1 and G1 of the IGBTs 5 and 9 constructing the upper arm and the emitter auxiliary internal wiring between the emitter auxiliary terminals ES1 and ES1 of the IGBTs 5 and 9. By the transverse electric current, voltage is generated in the parasitic inductance of the gate internal wiring and the emitter auxiliary internal wiring. It was known that since the Zener diodes ZD1 and ZD2 are not provided, by this voltage, the voltage Vge between the gate terminal G1 and the emitter auxiliary terminal ES1 of the IGBTs 5 and 9 becomes higher than the gate voltage which makes the IGBTs (5, 9) enter the on state. Due to positive feedback by jumping of the potential Vge, larger short circuit current flows in the upper and lower arms. Consequently, it was known that protection of the switching elements in the on state (in this example, the two switching elements of the upper arm: IGBTs 5 and 9) is disturbed.

In the embodiment, by providing a Zener diode between a gate terminal and a reference potential terminal, jumping of the voltage Vge between the gate terminal and the reference potential terminal (emitter auxiliary terminal) in the event of occurrence of short circuit is suppressed, and the switching elements at the time of short circuit can be stably protected.

Figure 6:
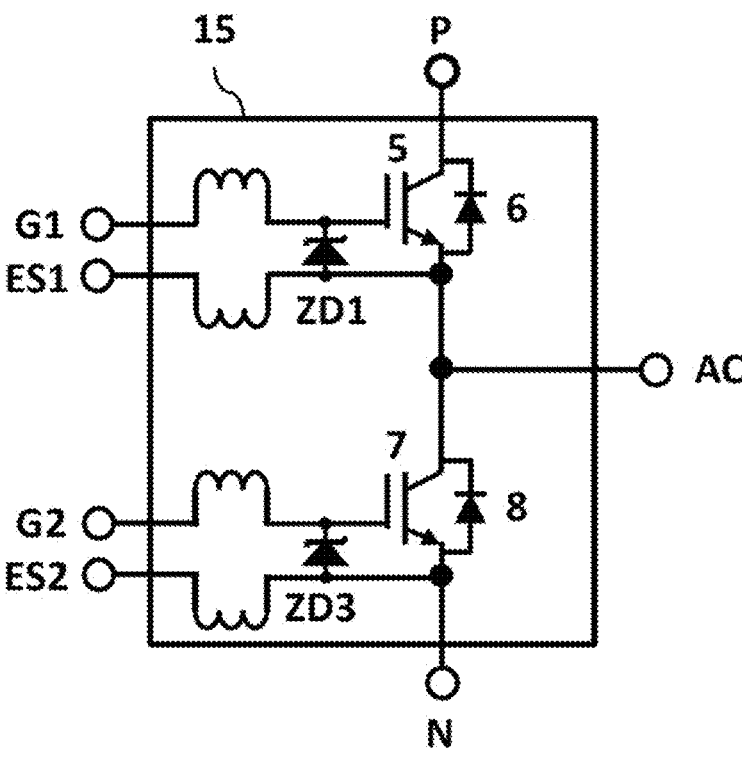
FIG. 6 is a diagram illustrating a configuration example of a basic module of the power semiconductor module of FIG. 1.

Subsequently, a basic module configuration example of the power semiconductor module according to the embodiment will be described with reference to FIG. 6. FIG. 6 is a diagram explaining a basic module configuration example of the power semiconductor module of FIG. 1.

A power semiconductor module 1 having a 2-in-1 structure has a casing 15 and a plurality of external terminals led to the outside of the casing 15. In this example, the plurality of external terminals are the positive-electrode main terminal P, the negative-electrode main terminal N, the gate electrode G1 for the upper arm, the gate electrode G2 for the lower arm, the emitter auxiliary electrode ES1 for the upper arm, the emitter auxiliary electrode ES2 for the lower arm, and the AC main terminal AC.

In the casing 15, as representatively illustrated by an equivalent circuit, there are the IGBT 5 and the diode 6 constructing the upper arm, the IGBT 7 and the diode 8 constructing the lower arm, the first Zener diode ZD1 provided between the gate terminal and the emitter auxiliary terminal of the IGBT 5, and the second Zener diode ZD3 provided between the gate terminal and the emitter auxiliary terminal of the IGBT 7.

The casing 15 is configured by, for example, a metal base for heat dissipation, insulating substrates (for example, a first insulating substrate, a third insulating substrate, a fourth insulating substrate, and a sixth insulating substrate but the number of insulating substrates is not limited to this number) on which a wiring pattern is formed, which is joined by solder or the like on the metal base for heat dissipation, an encapsulation resin, and the like. The encapsulation resin is formed so as to cover the upper side of the insulation substrates (for example, the first insulating substrate, the third insulating substrate, the fourth insulating substrate, and the sixth insulating substrate) which are provided on the metal base.

For example, on a wiring pattern of the first insulating substrate, a semiconductor chip of the IGBT 5 and a semiconductor chip of the diode 6 constructing the upper arm are joined. On a wiring pattern of the fourth insulating substrate, a semiconductor chip of the IGBT 7 and a semiconductor chip of the diode 8 constructing the lower arm are joined. A semiconductor chip of the first Zener diode ZD1 is joined on the wiring pattern of the third insulating substrate, and a semiconductor chip of the second Zener diode ZD3 is joined on the wiring pattern of the sixth insulating substrate.

The IGBT 5 may be formed by one semiconductor chip or formed by a plurality of semiconductor chips. The diode 6 may be also formed by one semiconductor chip or formed by a plurality of semiconductor chips. The IGBT 7 and the diode 8 are also formed in a similar manner.

The IGBT 5 and the diode 6 constructing the upper arm may be also formed by IGBTs 5a and 5b and diodes 6a and 6b connected in parallel as illustrated in FIGS. 7 to 10 which will be described later. In this case, the semiconductor chip of the IGBT 5b and the semiconductor chip of the diode 6b are joined on the wiring pattern of the second insulating substrate. The IGBT 7 and the diode 8 constructing the lower arm may be formed by IGBTs 7a and 7b and diodes 8a and 8b connected in parallel as illustrated in FIGS. 7 to 10. In this case, the semiconductor chip of the IGBT 7b and the semiconductor chip of the diode 8b are joined on the wiring pattern of the fifth insulating substrate. The IGBT 5a may be formed by one semiconductor chip or formed by a plurality of semiconductor chips. FIGS. 7 to 10 illustrate an example that the IGBT 5a is formed by two semiconductor chips. The IGBTs 5b, 7a, and 7b and the diodes 6a, 6b, 8a, and 8b are formed in a similar manner.

Figure 7:
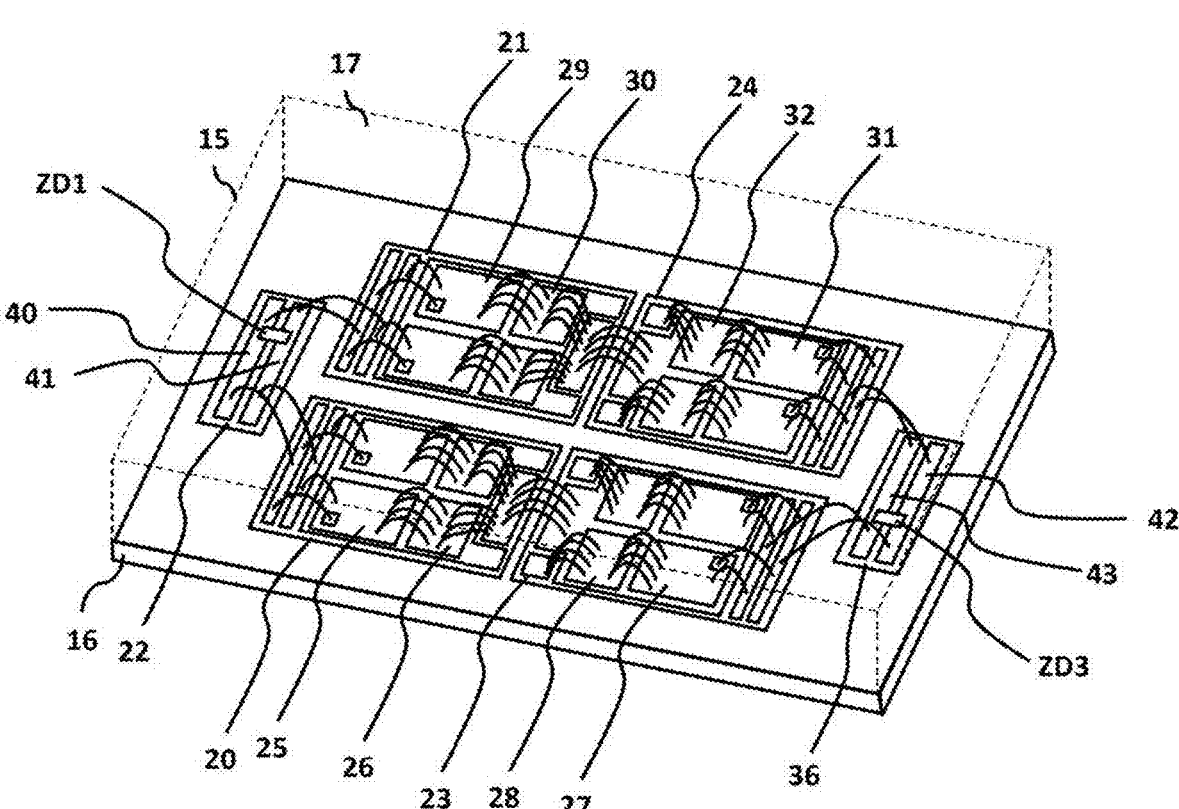
FIG. 7 is a perspective diagram conceptually illustrating a configuration example of the inside of a power semiconductor module having the 2-in-1 structure according to the embodiment.
Figure 8:
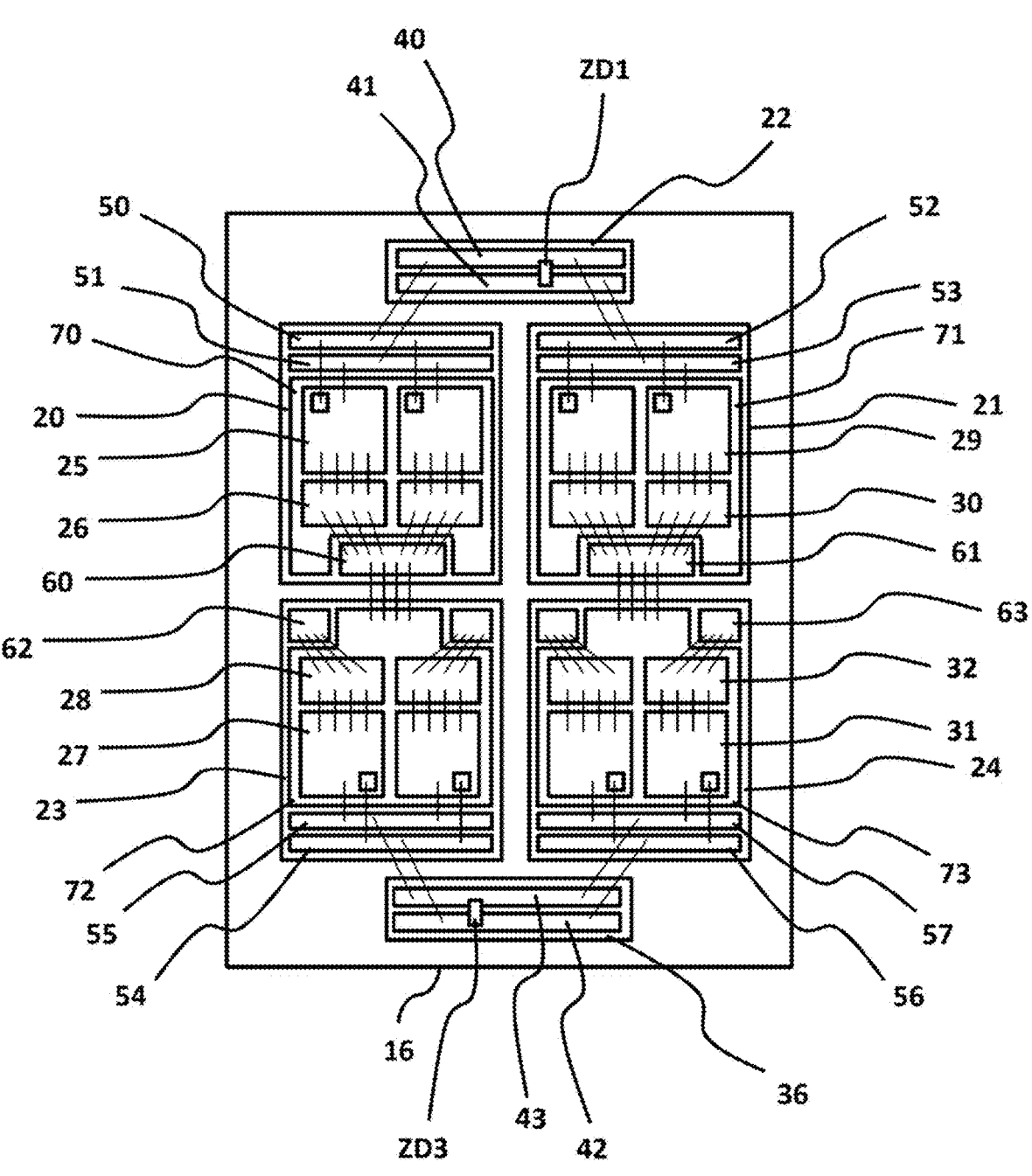
FIG. 8 is a plan view conceptually illustrating a configuration example of the inside of the power semiconductor module of FIG. 7.
Figure 9:
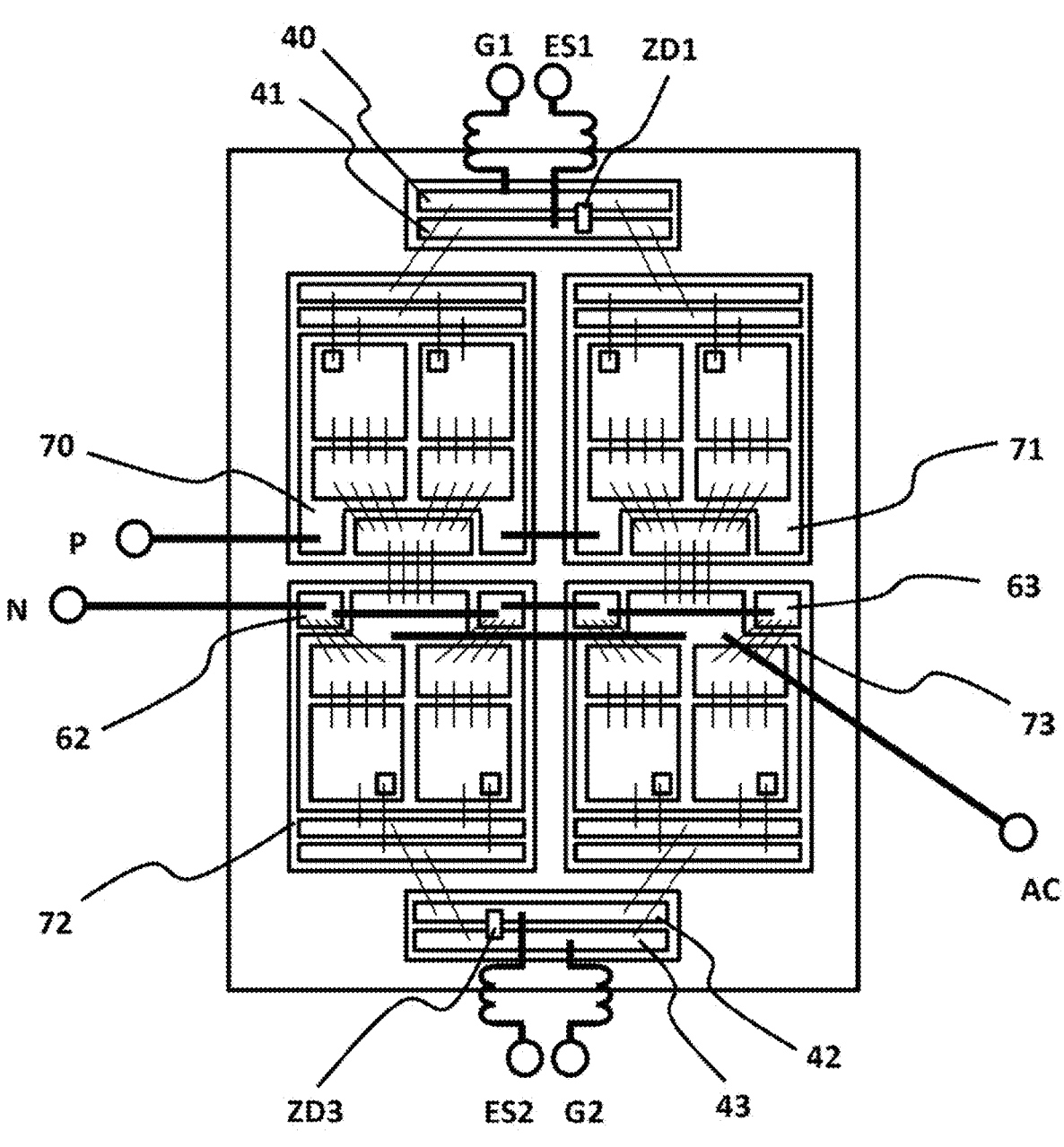
FIG. 9 is a plan view conceptually illustrating a configuration example of external terminals of the power semiconductor module of FIG. 7.
Figure 10:
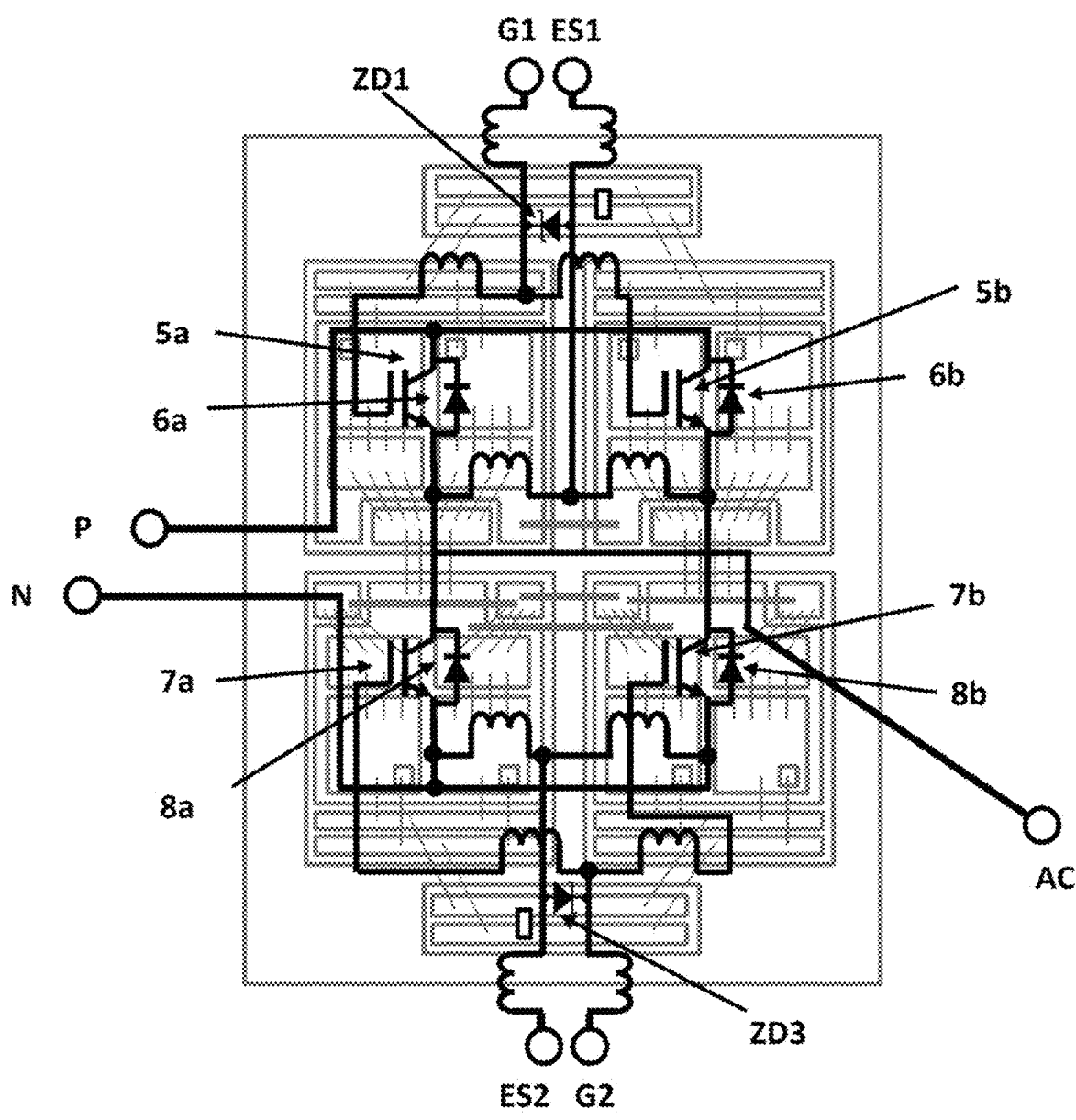
FIG. 10 is a diagram conceptually illustrating an equivalent circuit of the power semiconductor module of FIG. 7.

Subsequently, a configuration example of the power semiconductor module according to the embodiment will be described with reference to the drawings. FIG. 7 is a perspective view conceptually illustrating a configuration example of the inside of the power semiconductor module having the 2-in-1 structure according to the embodiment. FIG. 8 is a plan view conceptually illustrating a configuration example of the inside of the power semiconductor module of FIG. 7. FIG. 9 is a plan view conceptually illustrating a configuration example of external terminals of the power semiconductor module of FIG. 7. FIG. 10 is a diagram conceptually illustrating an equivalent circuit of the power semiconductor module of FIG. 7. In FIGS. 7, 8, and 9 and FIGS. 11 and 12 which will be described later, thin solid lines and thick solid lines illustrated between semiconductor chips, between a semiconductor chip and a wiring pattern, between wiring patterns, and the like indicate conductors such as metal wires. In FIGS. 7, 8, and 9 and FIGS. 11 and 12 which will be described later, to avoid complication, reference numerals of the conductors such as metal wires are omitted.

As illustrated in FIGS. 7 and 8, the casing 15 of the power semiconductor module 1 having the 2-in-1 structure is configured by a metal base 16 for heat dissipation, a first insulating substrate 20, a second insulating substrate 21, a third insulating substrate 22, a fourth insulating substrate 23, a fifth insulating substrate 24, and a sixth insulating substrate 36 which are joined on the metal base 16 for heat dissipation by solder or the like, an encapsulation resin 17, and the like.

A wiring pattern is formed on the first insulating substrate 20, and a first semiconductor chip 25 of the IGBT (first switching element) 5a and a semiconductor chip 26 of the diode 6a constructing the upper arm are joined (or mounted) on the wiring pattern. In this example, two semiconductor chips 25 and two semiconductor chips 26 are provided on the first insulating substrate 20.

A wiring pattern is formed on the second insulating substrate 21, and a first semiconductor chip 29 of the IGBT (second switching element) 5b and a semiconductor chip 30 of the diode 6b are joined on the wiring pattern. In this example, two semiconductor chips 29 and two semiconductor chips 30 are mounted on the second insulating substrate 21.

On the third insulating substrate 22, a wiring pattern (first wiring pattern) 40 for the gate of the upper arm and a wiring pattern (second wiring pattern) 41 for the emitter auxiliary of the upper arm are formed. On the wiring patterns 40 and 41, the semiconductor chip of the first Zener diode ZD1 is joined. The anode electrode of the Zener diode ZD1 is joined to the wiring pattern 41, and the cathode electrode of the Zener diode ZD1 is joined to the wiring pattern 40. As illustrated in FIG. 9, the wiring pattern 40 is electrically connected to the gate electrode G1 for the upper arm by a conductor. As illustrated in FIG. 9, the wiring pattern 41 is electrically connected to the emitter auxiliary electrode ES1 for the upper arm by a conductor.

A wiring pattern is formed on the fourth insulating substrate 23, and a third semiconductor chip 27 of the IGBT (third switching element) 7a and a semiconductor chip 28 of the diode 8a are joined on the wiring pattern. In this example, two semiconductor chips 27 and two semiconductor chips 28 are mounted on the fourth insulating substrate 23.

A wiring pattern is formed on the fifth insulating substrate 24, and a fourth semiconductor chip 31 of the IGBT (fourth switching element) 7b and a semiconductor chip 32 of the diode 8b are joined on the wiring pattern. In this example, two semiconductor chips 31 and two semiconductor chips 32 are mounted on the fifth insulating substrate 24.

On the sixth insulating substrate 36, a wiring pattern (third wiring pattern) 42 for the gate of the lower arm and a wiring pattern (fourth wiring pattern) 43 for the emitter auxiliary of the lower arm are formed. On the wiring patterns 42 and 43, the semiconductor chip of the second Zener diode ZD2 is joined. The anode electrode of the Zener diode ZD2 is joined to the wiring pattern 43, and the cathode electrode of the Zener diode ZD2 is joined to the wiring pattern 42. As illustrated in FIG. 9, the wiring pattern 42 is electrically connected to the gate electrode G2 for the lower arm by a conductor. As illustrated in FIG. 9, the wiring pattern 43 is electrically connected to the emitter auxiliary electrode ES2 for the lower arm by a conductor.

As illustrated in FIG. 8, on the first insulating substrate 20, a wiring pattern (fifth wiring pattern) 50 for the gate of the upper arm and a wiring pattern (sixth wiring pattern) 51 for the emitter auxiliary of the upper arm are formed. In the first semiconductor chip 25 of the IGBT 5a, a first collector terminal is formed on the rear face of the chip, and a first gate terminal and a first emitter terminal are formed on the surface of the chip. In the semiconductor chip 26 of the diode 6a, a cathode terminal is formed on the rear face of the chip, and an anode terminal is formed on the surface of the chip. The first collector terminal and the cathode terminal are electrically connected by a wiring pattern 70 on the first insulating substrate 20. The gate terminal of the first semiconductor chip 25 is electrically connected to the wiring pattern 50 for the gate by a conductor such as a metal wire, and the wiring pattern 50 for the gate is electrically connected to the wiring pattern by a conductor such as a metal wire. The wiring pattern 70 is electrically connected to the positive-electrode main terminal P by a conductor such as a metal plate.

The first emitter terminal of the first semiconductor chip 25 is electrically connected to the wiring pattern 51 for emitter auxiliary by a conductor such as a metal wire, and the wiring pattern 51 for the emitter auxiliary is electrically connected to the wiring pattern 41 by a conductor such as a metal wire. The emitter terminal of the first semiconductor chip 25 is also electrically connected to the anode terminal of the semiconductor chip 26 by a conductor such as a metal wire. The anode terminal of the semiconductor chip 26 is electrically connected to a wiring pattern 60 which is formed on the first insulating substrate by a conductor such as a metal wire. The wiring pattern 60 is electrically connected to a wiring pattern 72 (the wiring pattern 72 corresponds to a collector) which is formed on the fourth insulating substrate 23 by a conductor such as a metal wire.

As illustrated in FIG. 8, on the second insulating substrate 21, a wiring pattern (seventh wiring pattern) 52 for the gate of the upper arm and a wiring pattern (eighth wiring pattern) 53 for the emitter auxiliary of the upper arm are formed. In the second semiconductor chip 29 of the IGBT 5b, a second collector terminal is formed on the rear face of the chip, and a second gate terminal and a second emitter terminal are formed on the surface of the chip. In the semiconductor chip 30 of the diode 6b, a cathode terminal is formed on the rear face of the chip, and an anode terminal is formed on the surface of the chip. The second collector terminal and the cathode terminal are electrically connected by a wiring pattern 71 on the second insulating substrate 21. The second gate terminal of the semiconductor chip 29 is electrically connected to the wiring pattern 52 for the gate by a conductor such as a metal wire, and the wiring pattern 52 for the gate is electrically connected to the wiring pattern 40 by a conductor such as a metal wire. As illustrated in FIG. 9, the wiring pattern 71 is electrically connected to the wiring pattern 70 by a conductor such as a metal wire and electrically connected to the positive-electrode main terminal P.

The second emitter terminal of the semiconductor chip 29 is electrically connected to a wiring pattern 53 for the emitter auxiliary by a conductor such as a metal wire, and the wiring pattern 53 for the emitter auxiliary is electrically connected to the wiring pattern 41 by a conductor such as a metal wire. The second emitter terminal of the semiconductor chip 29 is electrically connected to the anode terminal of the semiconductor chip 30 by a conductor such as a metal wire. The anode terminal of the semiconductor chip 30 is electrically connected to a wiring pattern 61 which is formed on the second insulating substrate 21 by a conductor such as a metal wire. The wiring pattern 61 is electrically connected to a wiring pattern 73 which is formed on the fifth insulating substrate 24 (the wiring pattern 73 corresponds to a collector) by a conductor such as a metal wire.

As illustrated in FIG. 8, on the fourth insulating substrate 23, a wiring pattern (ninth wiring pattern) 54 for the gate of the lower arm and a wiring pattern (tenth wiring pattern) 55 for the emitter auxiliary of the lower arm are formed. In the third semiconductor chip 27 of the IGBT 7a, a third collector terminal is formed on the rear face of the chip, and a third gate terminal and a third emitter terminal are formed on the surface of the chip. In the semiconductor chip 28 of the diode 8a, a cathode terminal is formed on the rear face of the chip, and an anode terminal is formed on the surface of the chip. The third collector terminal and the cathode terminal are electrically connected by the wiring pattern 72 on the fourth insulating substrate 23. The wiring pattern 72 is electrically connected to the wiring pattern 60 by a conductor such as a metal wire. The third gate terminal of the third semiconductor chip 27 is electrically connected to the wiring pattern 54 for the gate by a conductor such as a metal wire, and the wiring pattern 54 for the gate is electrically connected to the wiring pattern 42 by a conductor such as a metal wire.

The third emitter terminal of the third semiconductor chip 27 is electrically connected to the wiring pattern 55 for the emitter auxiliary by a conductor such as a metal wire, and the wiring pattern 55 for the emitter auxiliary is electrically connected to the wiring pattern 43 by a conductor such as a metal wire. The third emitter terminal of the third semiconductor chip 27 is also electrically connected to the anode terminal of the semiconductor chip 28 by a conductor such as a metal wire. The anode terminal of the semiconductor chip 28 is electrically connected to a wiring pattern 62 which is formed on the fourth insulating substrate 23 by a conductor such as a metal wire. As illustrated in FIG. 9, the wiring pattern 62 is electrically connected to the negative-electrode main terminal N by a conductor such as a metal plate. The wiring patterns 62 and 62 are electrically connected by a conductor such as a metal wire. As illustrated in FIG. 9, the wiring pattern 72 is electrically connected to the AC main terminal AC by a conductor such as a metal plate.

As illustrated in FIG. 8, on the fifth insulating substrate 24, a wiring pattern (eleventh wiring pattern) 56 for the gate of the lower arm and a wiring pattern (twelfth wiring pattern) 57 for the emitter auxiliary of the lower arm are formed. In the fourth semiconductor chip 31 of the IGBT 7b, a fourth collector terminal is formed on the rear face of the chip, and a fourth gate terminal and a fourth emitter terminal are formed on the surface of the chip. In the semiconductor chip 32 of the diode 8b, a cathode terminal is formed on the rear face of the chip, and an anode terminal is formed on the surface of the chip. The fourth collector terminal and the cathode terminal are electrically connected by the wiring pattern 73 on the fifth insulating substrate 24. The wiring pattern 73 is electrically connected to the wiring pattern 61 by a conductor such as a metal wire. The fourth gate terminal of the fourth semiconductor chip 31 is electrically connected to the wiring pattern 56 for the gate by a conductor such as a metal wire, and the wiring pattern 56 for the gate is electrically connected to the wiring pattern 42 by a conductor such as a metal wire.

The fourth emitter terminal of the fourth semiconductor chip 31 is electrically connected to the wiring pattern 57 for the emitter auxiliary by a conductor such as a metal wire, and the wiring pattern 57 for the emitter auxiliary is electrically connected to the wiring pattern 43 by a conductor such as a metal wire. The fourth emitter terminal of the fourth semiconductor chip 31 is also electrically connected to the anode terminal of the semiconductor chip 32 by a conductor such as a metal wire. The anode terminal of the semiconductor chip 32 is electrically connected to the wiring pattern 63 which is formed on the fifth insulating substrate 24 by a conductor such as a metal wire. As illustrated in FIG. 9, the wiring pattern 63 is electrically connected to the wiring pattern 62 by a conductor such as a metal wire and electrically connected to the negative-electrode main terminal N. The wiring patterns 63 and 63 are electrically connected by a conductor such as a metal wire. As illustrated in FIG. 9, the wiring pattern 73 is electrically connected to the AC main terminal AC by a conductor such as a metal wire. As illustrated in FIG. 9, the wiring pattern 73 is electrically connected to the wiring pattern 72 by a conductor such as a metal wire.

In such a manner, the power semiconductor module 1 as an equivalent circuit as illustrated in FIG. 10 can be configured.

In the embodiment, by providing the Zener diodes ZD1 and ZD3 between the gate terminals G1 and G2 and the reference potential terminals ES1 and ES2, respectively, jumping of the voltage Vge between the gate terminal and the reference potential terminal (the emitter auxiliary terminal) in the event of short circuit is suppressed, and the switching elements in the event of short circuit can be stably protected.

Modification

Figure 11:
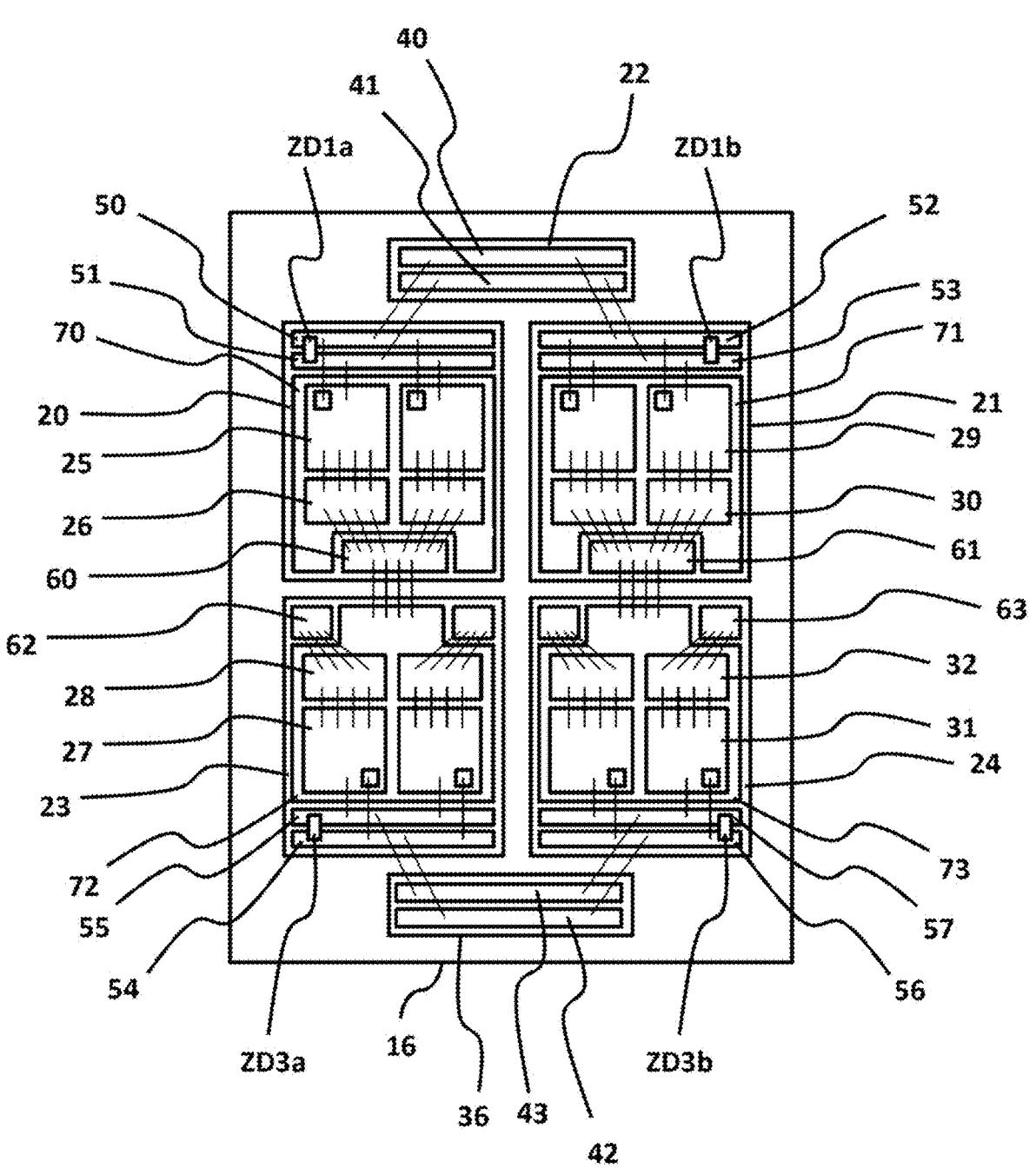
FIG. 11 is a plan view conceptually illustrating a configuration example of the inside of a power semiconductor module according to a modification.
Figure 12:
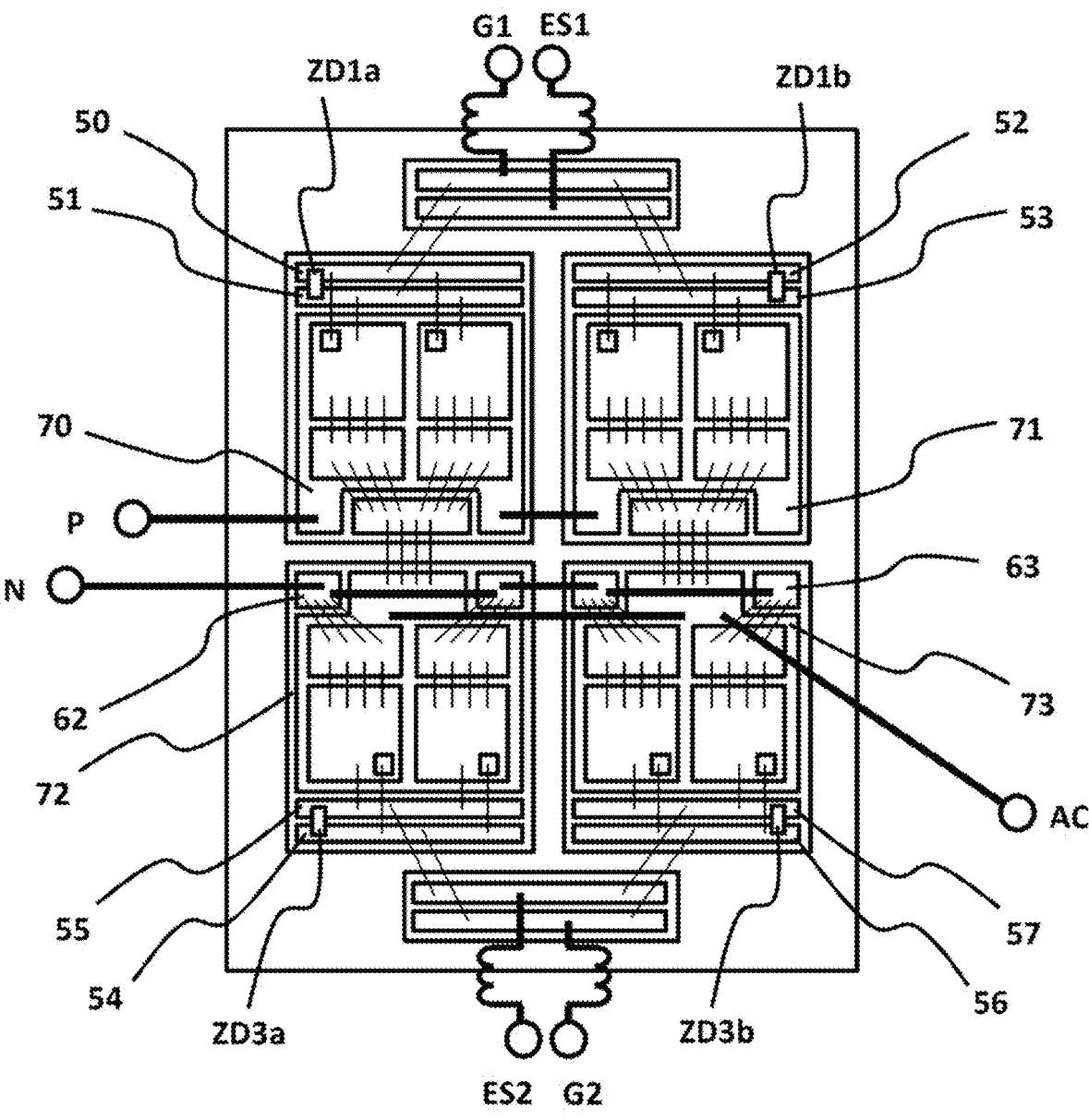
FIG. 12 is a plan view conceptually illustrating a configuration example of external terminals of the power semiconductor module of FIG. 11.
Figure 13:
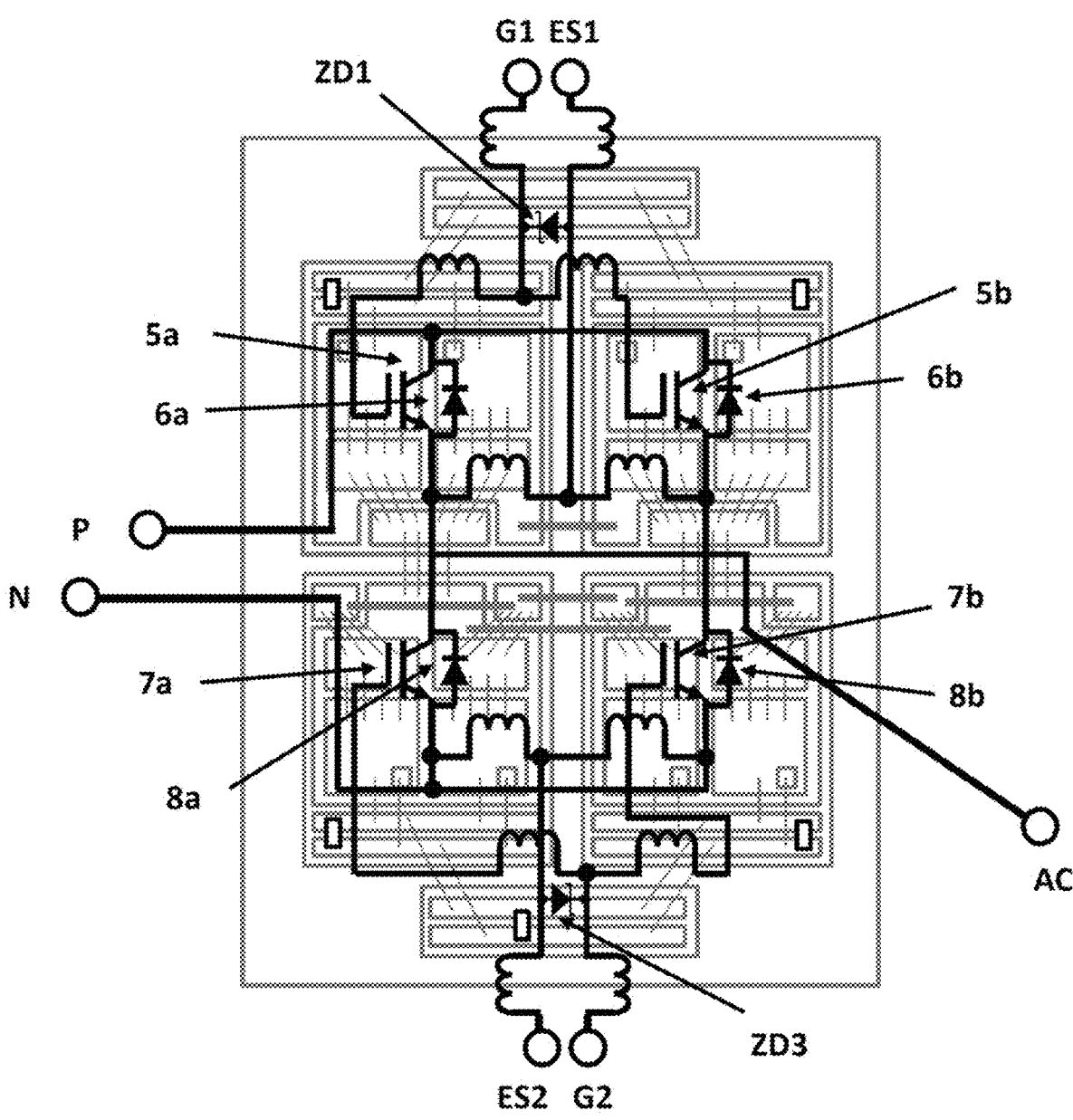
FIG. 13 is a diagram conceptually illustrating an equivalent circuit of the power semiconductor module of FIG. 11.

Subsequently, a configuration example of the case where Zener diodes are provided for wiring patterns on the first insulating substrate 20, the second insulating substrate 21, the fourth insulating substrate 23, and the fifth insulating substrate 24 will be described. FIG. 11 is a plan view conceptually illustrating a configuration example of the inside of a power semiconductor module according to a modification. FIG. 12 is a plan view conceptually illustrating a configuration example of external terminals of the power semiconductor module of FIG. 11. FIG. 13 is a diagram conceptually illustrating an equivalent circuit of the power semiconductor module of FIG. 11.

As illustrated in FIGS. 11, 12, and 13, in a power semiconductor module 1*a* according to the modification, the Zener diode ZD1 is configured by a first Zener diode ZD1*a* and a second Zener diode ZD1*b*, and the Zener diode ZD3 is configured by a third Zener diode ZD3*a* and a fourth Zener diode ZD3*b*. The first Zener diode ZD1*a* is joined on the wiring pattern (first wiring pattern) 50 for the gate of the upper arm and the wiring pattern (second wiring pattern) 51 for the emitter auxiliary of the upper arm of the first insulating substrate 20. The second Zener diode ZD1*b* is joined on the wiring pattern (third wiring pattern) 52 for the gate of the upper arm and the wiring pattern (fourth wiring pattern) 53 for the emitter auxiliary of the upper arm of the second insulating substrate 21. Similarly, the third Zener diode ZD3*a* is joined on the wiring pattern (fifth wiring pattern) 54 for the gate of the lower arm and the wiring pattern (sixth wiring pattern) 55 for the emitter auxiliary of the lower arm of the forth insulating substrate 23. The forth Zener diode ZD3*b* is joined on the wiring pattern (seventh wiring pattern) 56 for the gate of the lower arm and the wiring pattern (eighth wiring pattern) 57 for the emitter auxiliary of the lower arm of the fifth insulating substrate 24. Since the other configurations and effects of the power semiconductor module 1*a* illustrated in FIGS. 11, 12, and 13 are the same as those of the power semiconductor module 1 illustrated in FIGS. 8, 9, and 10, repetitive description will not be given.

In the power semiconductor module 1*a* according to the modification, by providing the Zener diodes ZD1*a*, ZD1*b*, ZD3*a*, and ZD3*b* for the wiring patterns of the first insulating substrate 20, the second insulating substrate 21, the fourth insulating substrate 23, and the fifth insulating substrate 24, effects similar to those of the embodiment can be obtained.

The power semiconductor modules 1 and 1*a* according to the embodiment of FIGS. 7 to 10 and the modification of FIGS. 11 to 13 are configured as follows.

1) The power semiconductor module 1, 1*a* has a first signal path between the gate terminal G1 of the power semiconductor module 1, 1*a* and the gate terminal of the semiconductor chip 25, and a second signal path between the reference potential terminal ES1 of the power semiconductor module 1, 1*a* and the emitter terminal of the semiconductor chip 25. Between the first signal path and the second signal path, the Zener diode (ZD1, ZD1*a*) is provided.

In the embodiment, the Zener diode (ZD1) is joined between the wiring pattern 40 for the gate of the upper arm of the third insulating substrate 22 constructing a part of the first signal path and the wiring pattern 41 for the emitter auxiliary of the upper arm of the third insulating substrate 22 constructing a part of the second signal path. The Zener diode (ZD1*a*) is joined between the wiring pattern 50 for the gate of the upper arm of the first insulating substrate 20 constructing a part of the first signal path and the wiring pattern 51 for the emitter auxiliary of the upper arm of the first insulating substrate 20 constructing a part of the second signal path.

2) The power semiconductor module 1, 1*a* has a third signal path between the gate terminal G2 of the power semiconductor module 1, 1*a* and the gate terminal of the semiconductor chip 27, and a fourth signal path between the reference potential terminal ES2 of the power semiconductor module 1, 1*a* and the emitter terminal of the semiconductor chip 27. Between the third and fourth signal paths, a Zener diode (ZD3, ZD3*a*) is provided.

In the embodiment, the Zener diode (ZD3) is joined between the wiring pattern 42 for the gate of the lower arm of the sixth insulating substrate 36 constructing a part of the third signal path and the wiring pattern 43 for the emitter auxiliary of the lower arm of the sixth insulating substrate 36 constructing a part of the fourth signal path. In the modification, the Zener diode (ZD3*a*) is joined between the wiring pattern 54 for the gate of the lower arm of the fourth insulating substrate 23 constructing a part of the third signal path and the wiring pattern 55 for the emitter auxiliary of the lower arm of the fourth insulating substrate 23 constructing a part of the fourth signal path.

3) The power semiconductor module 1, 1*a* has a fifth signal path between the gate terminal G1 of the power semiconductor module 1, 1*a* and the gate terminal of the semiconductor chip 29, and a sixth signal path between the reference potential terminal ES1 of the power semiconductor module 1, 1*a* and the emitter terminal of the semiconductor chip 29. Between the fifth signal path and the sixth signal path, a Zener diode (ZD1, ZD1*b*) is provided.

In the embodiment, the Zener diode (ZD1) is joined between the wiring pattern 40 for the gate of the upper arm of the third insulating substrate 22 that constitutes a part of the fifth signal path and the wiring pattern 41 for the emitter auxiliary of the upper arm of the third insulating substrate 22 that constitutes a part of the sixth signal path. In the modification, the Zener diode (ZD1*b*) is joined between the wiring pattern 52 for the gate of the upper arm of the second insulating substrate 21 that constitutes a part of the fifth signal path and the wiring pattern 53 for the emitter auxiliary of the upper arm of the second insulating substrate 21 that constitutes a part of the sixth signal path.

4) The power semiconductor module 1, 1*a* has a seventh signal path between the gate terminal G2 of the power semiconductor module 1, 1*a* and the gate terminal of the semiconductor chip 31, and an eighth signal path between the reference potential terminal ES2 of the power semiconductor module 1, 1*a* and the emitter terminal of the semiconductor chip 31. A Zener diode (ZD3, ZD3*b*) is provided between the seventh signal path and the eighth signal path.

In the embodiment, a Zener diode (ZD3) is joined between the wiring pattern 42 for the gate of the lower arm of the sixth insulating substrate 36 that constitutes a part of the seventh signal path, and the wiring pattern 43 for the emitter auxiliary of the lower arm of the sixth insulating substrate 36 that constitutes a part of the eighth signal path. In the modification, a Zener diode (ZD3*b*) is joined between the wiring pattern 56 for the gate of the lower arm of the fifth insulating substrate 24 that constitutes a part of the seventh signal path, and the wiring pattern 57 for the emitter auxiliary of the lower arm of the fifth insulating substrate 24 that constitutes a part of the eighth signal path.

In the embodiment and the modification, the present invention has been described on the basis of the power semiconductor modules 1 and 1*a* having the 2-in-1 structure. However, the present invention is not limited to the 2-in-1 structure but also can be applied to a power semiconductor module having the 1-in-1 structure or the 6-in-1 structure. In the power semiconductor module having the 1-in-1 structure or the 6-in-1 structure, by joining the Zener diode (ZD1, ZD1*a*, ZD1*b*, ZD3, ZD3*a*, ZD3*b*, or the like, hereinafter, abbreviated as ZD1 to ZD3*b*) between the gate electrode (G1, G2, or the like) and the emitter auxiliary electrode (ES1, ES2, or the like) in the module and providing the Zener diode (ZD1 to ZD3*b*) on the inside of the module, effects similar to those of the embodiment and the modification can be obtained.

In the power semiconductor module 1, 1*a* of the present invention, the Zener diode (ZD1 to ZD3*b*) is provided on the third insulating substrate 22, the sixth insulating substrate 36, the first insulating substrate 20, the second insulating substrate 21, the fourth insulating substrate 23, and the fifth insulating substrate 24, and the Zener diode (ZD1 to ZD3*b*) is provided in the power semiconductor module 1, 1*a*. In the present invention, the Zener diode (ZD1 to ZD3*b*) is not provided in the semiconductor chips 25, 27, 29, and 31 of the IGBT.

A method of providing the Zener diode (ZD1 to ZD3*b*) in the semiconductor chips 25, 27, 29, and 31 of the IGBT is considered. However, in the semiconductor chips 25, 27, 29, and 31 of the IGBT, a test has to be conducted by applying voltage higher than the operation voltage (for example, 20V or higher with respect to a gate signal input 15V driving) to the gate in order to check soundness of the gate before shipment (or before assembling of the power semiconductor module). In this case, when the Zener diode (ZD1 to ZD3*b*) is provided in the semiconductor chips 25, 27, 29, and 31 of the IGBT, voltage equal to or higher than the clamp voltage of the Zener diode (ZD1 to ZD3*b*) cannot be applied to the gate, so that reliability of the gate cannot be assured.

A method of providing the Zener diode (ZD1 to ZD3*b*) on the outside of the power semiconductor module can be also considered. However, the parasitic inductance of the wiring of the configuration example (module externally attached) of providing the Zener diode (ZD1 to ZD3*b*) on the outside of the power semiconductor module is larger as compared with that in the configuration example (module internally attached) of providing the Zener diode (ZD1 to ZD3*b*) in the power semiconductor module 1, 1*a*, so that occurrence of jumping of the large voltage Vge in the event of occurrence of short-circuit breakage (mainly at the time of inrush) can be recognized by simulation.

Figure 14:
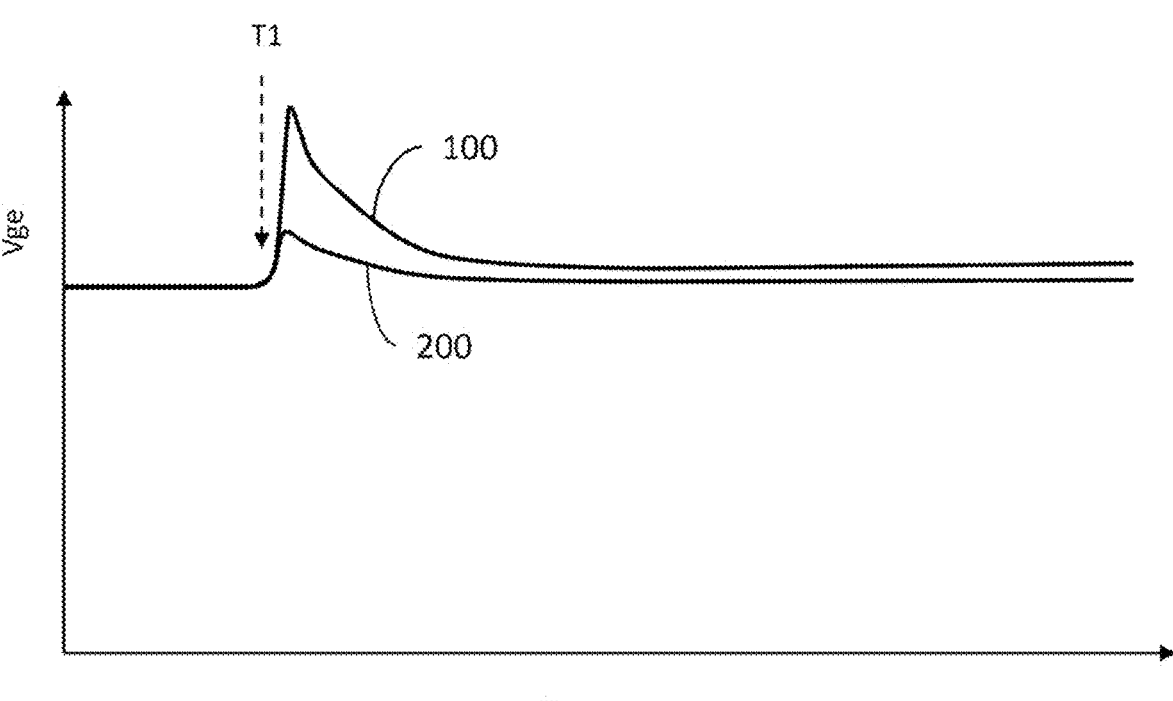
FIG. 14 is a graph illustrating a simulation result of voltage Vge.

FIG. 14 is a graph illustrating a simulation result of the voltage Vge. In FIG. 14, line 100 illustrates a change in the voltage Vge in the case where the Zener diode (ZD1 to ZD3*b*) is attached on the outside of the power semiconductor module, and line 200 indicates a change in the voltage Vge in the case where the Zener diode (ZD1 to ZD3*b*) is provided on the inside of the power semiconductor module 1, 1*a*. The horizontal axis indicates time I, and the vertical axis indicates the gate voltage Vge. T1 indicates the time of occurrence of short-circuit breakage.

As illustrated in FIG. 14, it is understood that, at the time of occurrence of short-circuit breakage, jumping of the large voltage Vge occurs in the line 100 as compared with the line 200. Consequently, regarding the effect of the clamp of the voltage Vge by the Zener diode (ZD1 to ZD3*b*), the configuration example (module internally provided) of providing the Zener diode (ZD1 to ZD3*b*) inside the power semiconductor module 1, 1*a* is advantageous.

Although the invention achieved by the inventors of the present invention has been concretely described on the basis of the embodiment, obviously, the present invention is not limited to the embodiment and the examples but can be variously changed.

LIST OF REFERENCE SIGNS

1, 1*a*: power semiconductor module
5, 7, 9, 11: switching element (IGBT)
6, 8, 10, 12: diode
15: casing
20: first insulating substrate
21: second insulating substrate
22: third insulating substrate
23: fourth insulating substrate
24: fifth insulating substrate
36: sixth insulating substrate
300: power conversion device
ZD1, ZD1*a*, ZD1*b*, ZD2, ZD3, ZD3*a*, ZD3*b*, ZD4: Zener diode
P: positive-electrode main terminal
N: negative-electrode main terminal
G1: gate electrode for upper arm (gate terminal for upper arm)
G2: gate electrode for lower arm (gate terminal for lower arm)
ES1: emitter auxiliary electrode for upper arm (emitter auxiliary terminal for upper arm, reference potential terminal)
ES2: emitter auxiliary electrode for lower arm (emitter auxiliary terminal for lower arm, reference potential terminal)
AC: AC main terminal

The invention claimed is:

1. A power semiconductor module having at least an upper arm, comprising:

a Zener diode connected between a gate terminal and a reference potential terminal and provided on the outside of a semiconductor chip of a switching element and provided on an insulating substrate;

a casing which houses the insulating substrate; and a plurality of external electrodes provided to the casing and connected to the gate terminal and the reference potential terminal, wherein the switching element includes a first switching element and a second switching element, a first insulating substrate on which the first switching element as a component of the upper arm is mounted, and a second insulating substrate on which the second switching element as a component of the upper arm is mounted are included, the insulating substrate is a third insulating substrate having: the gate terminal supplying a gate signal to the first and second insulating substrates; and the reference potential terminal for detecting reference potential of each of the first and second insulating substrates, and the Zener diode is provided for the third insulating substrate.

2. The power semiconductor module according to claim 1, further comprising a switching element as a component of the upper arm, wherein Zener voltage of the Zener diode is set to a voltage value obtained by adding predetermined voltage to gate voltage which makes the switching element enter an on state.

3. A power semiconductor module comprising:

a casing;

a first gate electrode which is led to an outside of the casing;

a first reference potential electrode which is led to an outside of the casing;

a first switching element provided on the inside of the casing and configured by a first semiconductor chip having a first gate terminal and a first emitter terminal;

a first Zener diode provided on an inside of the casing;

a first signal path provided between the first gate electrode and the first gate terminal;

a second signal path provided between the first reference potential electrode and the first emitter terminal;

a third insulating substrate having a first wiring pattern that constitutes a part of the first signal path and a second wiring pattern that constitutes a part of the second signal path;

a first insulating substrate to which the first semiconductor chip is joined;

a second switching element provided on the inside of the casing and configured by a second semiconductor chip having a second gate terminal and a second emitter terminal;

a second insulating substrate to which the second semiconductor chip is joined;

a third signal path provided between the first gate electrode and the second gate terminal via the first wiring pattern; and a fourth signal path provided between the first reference potential electrode and the second emitter terminal via the second wiring pattern, wherein the first Zener diode is joined between the first wiring pattern and the second wiring pattern.

4. The power semiconductor module according to claim 3, further comprising:

a second gate electrode which is led to the outside of the casing;

a second reference potential electrode which is led to the outside of the casing;

a third switching element provided on the inside of the casing and configured by a third semiconductor chip having a third gate terminal and a third emitter terminal;

a fourth insulating substrate to which the third semiconductor chip is joined;

a fourth switching element provided on the inside of the casing and configured by a fourth semiconductor chip having a fourth gate terminal and a fourth emitter terminal;

a fifth insulating substrate to which the fourth semiconductor chip is joined; and a sixth insulating substrate, the power semiconductor module further comprising:

a second Zener diode provided on the inside of the casing;

a fifth signal path provided between the second gate electrode and the third gate terminal;

a sixth signal path provided between the second reference potential electrode and the third emitter terminal;

a seventh signal path provided between the second gate electrode and the fourth gate terminal; and an eighth signal path provided between the second reference potential electrode and the fourth emitter terminal, wherein the sixth insulating substrate has: a third wiring pattern that constitutes a part of the fifth signal path and the seventh signal path; and a fourth wiring pattern that constitutes a part of the sixth signal path and the eighth signal path, and the second Zener diode is joined between the third wiring pattern and the fourth wiring pattern.

5. The power semiconductor module according to claim 4, further comprising:

a positive-electrode main terminal which is led to the outside of the casing;

a negative-electrode main terminal which is led to the outside of the casing; and an AC main terminal which is led to the outside of the casing, wherein a collector terminal of each of the first and second semiconductor chips is connected to the positive-electrode main terminal, an emitter terminal of each of the first and second semiconductor chips and a collector terminal of each of the third and fourth semiconductor chips are connected to the AC main terminal, and an emitter terminal of each of the third and fourth semiconductor chips is connected to the negative-electrode main terminal.

6. The power semiconductor module according to claim 3, wherein the Zener voltage of the first Zener diode is set to a voltage value obtained by adding a predetermined voltage to a gate voltage which makes the first switching element enter an on state.

7. The power semiconductor module according to claim 4, wherein the Zener voltage of each of the first Zener diode and the second Zener diode is set to a voltage value obtained by adding a predetermined voltage to a gate voltage which makes the first to fourth switching elements enter an on state.

\* \* \* \* \*